United States Patent [19]

Kawashimo et al.

[11] Patent Number: 4,824,801

[45] Date of Patent: Apr. 25, 1989

[54] METHOD OF MANUFACTURING ALUMINUM BONDING PAD WITH PSG COATING

[75] Inventors: Hiroshi Kawashimo; Kouichi Nakagawa; Kou Shimomura, all of Hyogo, Japan

[73] Assignee: Mitsubishi Denki Kabushiki Kaisha, Tokyo, Japan

[21] Appl. No.: 94,645

[22] Filed: Sep. 9, 1987

[30] Foreign Application Priority Data

Sep. 9, 1986 [JP] Japan ................................ 61-213119
Sep. 9, 1986 [JP] Japan ................................ 61-213121

[51] Int. Cl.$^4$ ......................................... H01L 21/441
[52] U.S. Cl. ..................................... 437/187; 437/203; 357/71; 357/52
[58] Field of Search ................... 437/187, 203, 194; 357/73, 54, 52, 68, 71

[56] References Cited

U.S. PATENT DOCUMENTS

| 4,091,406 | 5/1978 | Lewis ............................... 357/54 |
| 4,091,407 | 5/1978 | Williams et al. ................ 437/213 |
| 4,097,889 | 6/1978 | Kern et al. ....................... 357/54 |
| 4,321,612 | 3/1982 | Murata et al. ................... 357/52 |
| 4,396,934 | 8/1983 | Nishida et al. ................... 357/52 |
| 4,472,730 | 9/1984 | Ohta .................................. 357/53 |
| 4,622,576 | 11/1986 | Buyndski ........................ 357/52 |
| 4,628,590 | 12/1986 | Udo et al. ....................... 437/19 |

FOREIGN PATENT DOCUMENTS

| 0118345 | 9/1981 | Japan ................................ 437/187 |
| 0031523 | 2/1983 | Japan ................................ 437/187 |
| 5560 | 1/1985 | Japan . |
| 9159 | 1/1985 | Japan . |
| 57646 | 4/1985 | Japan . |
| 0217645 | 10/1985 | Japan ................................ 437/187 |

Primary Examiner—Brian E. Hearn
Assistant Examiner—Tuan Nguyen
Attorney, Agent, or Firm—Lowe, Price, LeBlanc, Becker & Shur

[57] ABSTRACT

A polysilicon film is provided in a first region provided with a bonding pad on a silicon substrate and a second region apart from the first region and surrounding the first region, an aluminum film serving as a bonding pad is provided on the polysilicon film in the first region, a PSG (Phospho-Silicate Glass) film is provided on the polysilicon film in the second region, and an insulating protective film including no phosphorus is provided between the aluminum film and the PSG film.

1 Claim, 2 Drawing Sheets

METHOD OF MANUFACTURING ALUMINUM BONDING PAD WITH PSG COATING

BACKGROUND OF THE INVENTION

1. Field of the Invention

The present invention relates to a semiconductor device and a method of manufacturing the same and more particularly, to a bonding pad structure on a semiconductor element and a method of manufacturing the same.

2. Description of the Prior Art

FIG. 1 is a schematic cross sectional view showing a bonding pad portion of a conventional semiconductor device, and FIG. 2 is a plan view thereof. Referring now to FIGS. 1 and 2, description is made on a schematic structure of the bonding pad portion of the conventional semiconductor device. In FIG. 1, a field oxide film 2 is formed on the surface of the silicon substrate 1 into which a circuit element is incorporated. A silicon dioxide film (referred to as a PSG film hereinafter) 5 including phosphorus is then formed on the field xide film 2 as an insulating film. An aluminum (Al) film 6 is then formed on the PSG film 5 by evaporation or the like. An unnecessary portion of the aluminum film 6 is then etched away. An insulating protective film 7 is then formed on the PSG film 5 to cover an end of the aluminum film 6. As a result, a semiconductor device having an opening 7a and comprising a bonding pad formed of the aluminum film 6 is obtained. The aluminum film 6 is used as a bonding pad, to which a lead (not shown) such as gold (Au) is electrically connected.

In the conventional semiconductor device, the PSG film is used as an insulating film, to lower the melting point of the film by including phosphorus, flatten the film and increase the coating ability of a stepped portion (not shown) or the like. It is desirable in a manufacturing process that the PSG film 5 is provided on the entire substrate. However, in the conventional semiconductor device, the aluminum film 6 is directly formed on the PSG film 5 without any material, so that impurities in the PSG film 5, particularly phosphorus, is liable to be diffused into the aluminum film 6. Therefore, there are some problems. For example, the inherent bonding ability of the aluminum film 6 is decreased, and a gold-aluminum alloy layer formed on an interface between the aluminum film and the lead is early deteriorated. In addition, water infiltrated between the aluminum film 6 and the PSG film 5 reacts on phosphorus to produce phosphoric acid, so that the produced phosphoric acid corrodes aluminum.

The prior art related to the present invention of the present application is disclosed in Japanese Patent Laying-Open Gazettes No. 9159/1985, 5660/1985 and No. 57646/1985. The Japanese Patent Laying-Open Gazette No. 9159/1985 discloses a technique to prevent aluminum and silicon (Si) from causing an eutectic reaction by providing a barrier layer between the aluminum film and the silicon substrate. The Japanese Patent Laying-Open Gazette No. 5660/1985 discloses a barrier layer sufficiently immune to the temperature cycle at a high temperature and having strong adhesion to a bonding material. In addition, the Japanese Patent Laying-Open Gazette No. 57646/1985 discloses a technique for avoiding the contact resistance of the aluminum film and the silicon substrate. However, the gazettes do not disclose any technique for preventing a reaction of phosphorus include in the PSG film and the aluminum.

SUMMARY OF THE INVENTION

A primary object of the present invention is to provide a semiconductor device of which the reliability is improved by preventing phosphorus included in an insulating film from being diffused into an aluminum film constituting a bonding pad and a method of manufacturing the same.

The present invention is directed to a semiconductor device having a first region including a bonding pad, a second region apart from the first region and surrounding the first region, and a third region between the first region and the second region, comprising a semiconductor substrate, underlying films formed in the first and second regions on the semiconductor substrate, respectively, and having almost the same thiokness, an aluminum film formed in the first region on the underlying films and serving as a bonding pad, an insulating film formed in the second region on the underlying films and including phosphorus, and a diffusion preventing film formed in the third region on the semiconductor substrate for preventing phosphorus included in the insulating film from being diffused into the aluminum film.

Furthermore, a method of manufacturing a semiconductor device according to the present invention comprises the steps of preparing a semiconductor substrate, forming underlying films on the semiconductor substrate, forming an insulating film including phosphorus on the underlying films, etching away a portion of a region in which a bonding pad is to be formed on the insulating film and providing an opening in the insulating film, forming an aluminum film on the insulating film having an opening formed and the underlying films, applying a resist film to a region inside of the opening on the aluminum film and etching away unnecessary portions of the aluminum film and the underlying films utilizing the resist film and the insulating film as masks to separate the aluminum film from the insulating film, and forming a diffusion preventing film for preventing diffusion of phosphorus between the separated aluminum film and insulating film.

According to the present invention, since in a semiconductor device having a bonding pad formed of an aluminum film, a diffusion preventing film for preventing diffusion of phosphorus between an insulating film including phosphorus and the aluminum film is provided such that the aluminum film does not contact the insulating film including phosphorus, the bonding ability can be improved and early deterioration of gold-aluminum junction can be prevented, so that the reliability of a semiconductor element can be ensured for a longer time.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
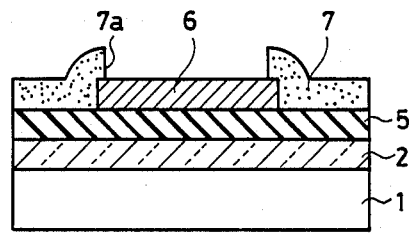
FIG. 1 is a schematic cross sectional view showing a bonding pad portion of a conventional semiconductor device.
Figure 2:
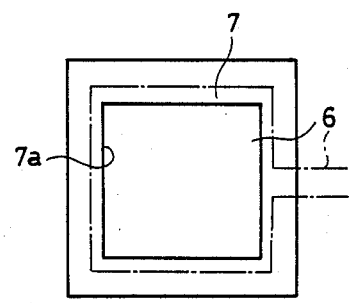
FIG. 2 is a plan view showing the bonding pad portion of the semiconductor device shown in FIG. 1.
Figure 3:
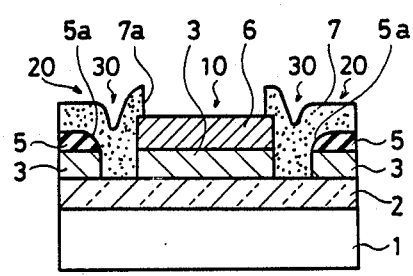
FIG. 3 is a schematic cross sectional view showing a bonding pad portion of a semiconductor device according to an embodiment of the present invention.
Figure 4:
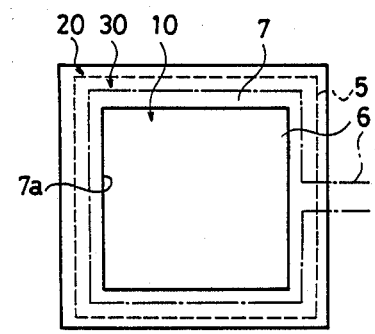
FIG. 4 is a plan view showing the bonding pad portion of the semiconductor device shown in FIG. 3.

FIG. 3 is a schematic cross sectional view showing a bonding pad portion of a semiconductor device according to an embodiment of the present invention, and FIG. 4 is a plan view thereof. Referring now to FIGS. 3 and 4, description is made on a structure of the bonding pad portion of the semiconductor device according to an embodiment of the present invention.

In FIG. 3, a field oxide film 2 is formed on the surface of a silicon substrate 1. A first region 10 and a second region 20 on the field oxide film 2 are provided with, for example, a polysilicon film 3. The first region 10 includes a bonding pad, and a second region 20 surrounds the first region 10 an end of which is apart from the outer edge by predetermined distance. The polysilicon film 3 is not provided as an essential component to the structure of the bonding pad portion but formed at the same time when the other region of a semiconductor element are forme.. Thus, if the other region is formed of, for example titanium nitride, a titanium nitride film is provided instead of the polysilicon film. An aluminum film 6 serving as a bonding pad is provided on the polysilicon film 3 in the first region 10. In addition, a PSG film 5 is provided on the polysilicon film 3 in the second region. The PSG film 5 protects a semiconductor device and stabilizes the performance thereof. An insulating protective film 7 is provided in a region 30 between the first region 10 and the second region 20 on the field oxide film 2. The insulating protective film 7 covers an end of the aluminum film 6 and is provided to extend on the PSG film 5. Silicon oxide and silicon nitride are used as the insulating protective film 7.

Figure 5:
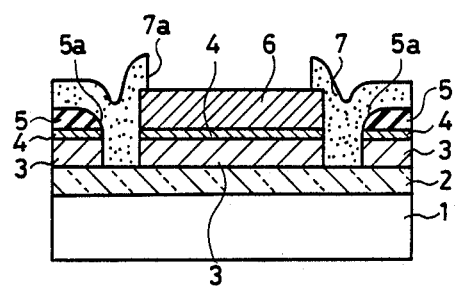
FIG. 5 is a schematic cross sectional view showing a bonding pad portion of a semiconductor device according to another embodiment of the present invention.
Figure 6:
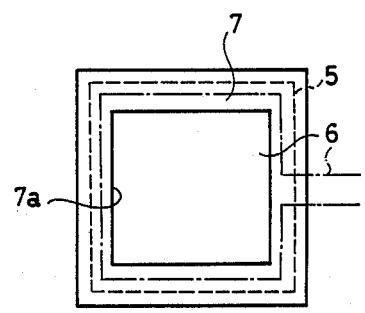
FIG. 6 is a plan view showing the bonding pad portion of the semiconductor device shown in FIG. 5.

FIG. 5 is a schematic cross sectional view showing a bonding pad portion of a semiconductor device according to another embodiment of the present invention, and FIG. 6 is a plan view thereof. In another embodiment shown in Figs. 5 and 6, the polysilicon film 3 and a molybdenum silicide film 4 are provided between the field oxide film 2 and the aluminum film 6. Similarly to the above described embodiment, the polysilicon film 3 and the molybdenum silicide film 4 are not essential components of the bonding pad portion.

Figure 7A:
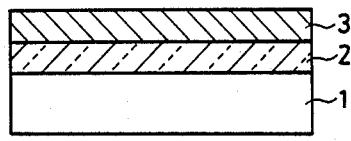
FIGS. 7A to 7G are diagrams for explaining a method of manufacturing the semiconductor device according to an embodiment of the present invention.
Figure 7E:
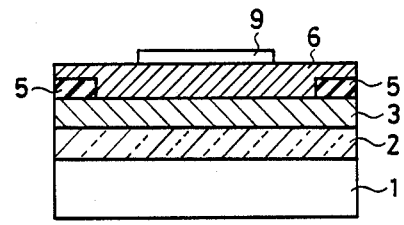
Figure 7B:
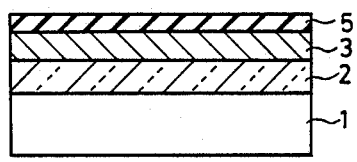
Figure 7F:
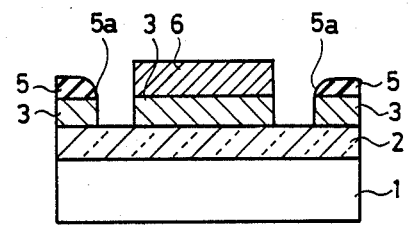
Figure 7C:
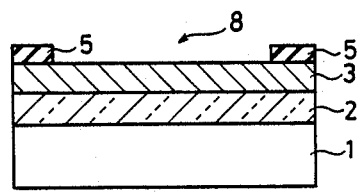
Figure 7G:
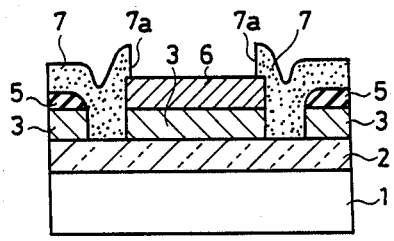
Figure 7D:
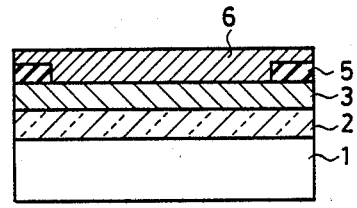

FIGS. 7A to 7G are diagrams for explaining a manufacturing method according to an embodiment of the present invention. Referring now to FIGS. 7A to 7G, description is made on a manufacturing method according to an embodiment of the present invention. As shown in Fig. 7A, the field oxide film 2 is formed on the surface of the silicon substrate 1 by, for example, thermal oxidation. The polysilicon film 3 is then provided on the field oxide film 2 by, for example, reduced pressure CVD. A titanium nitride film may be provided by, for example, sputtering, instead of the polysilicon film 3. As shown in FIG. 7B, the PSG film 5 is then formed on the polysilicon film 3 by, for example, normal pressure CVD. As shown in Fig. 7C, the PSG film 5 in a region 8 for forming a bonding pad is then etched away. As shown in FIG. 7D, the aluminum film 6 is then formed on the PSG film 5 and the polysilicon film 3 by, for example, sputtering. As shown in FIG. 7E, a resist film 9 is applied to a narrower region than the above described region 8 on the aluminum film 6. Unnecessary portions of the aluminum film 6 and the polysilicon film 3 are then removed utilizing the resist film 9 and the PSG film 5 as masks by dry etching, resulting in a structure shown in FIG. 7F. As that time, a part of the PSG film 5 is etched, so that a corner of an end thereof 5a is rounded off. The resist film is then removed. A predetermined region on the aluminum film 6 is then masked so that silicon dioxide, for example, is deposited by, for example, plasma CVD. As a result, the insulating protective film 7 is formed. Silicon nitride may be used as the insulating protective film 7. The manufacturing method according to another embodiment shown in FIGS. 5 and 6 is the same as the above described embodiment.

Although in the above described embodiments, a silicon substrate is used as a semiconductor substrate, it is not intended to limit the same. Any semiconductor substrate may be used.

According to the above described embodiment, since the PSG film 5 and the aluminum film 6 are separated, phosphorus included in the PSG film 5 is not diffused into the aluminum film 6. Thus, the bonding ability of the bonding pad can be prevented from decreasing due to the effect of phosphorus. In addition, an aluminum film is not corroded by phosphoric acid produced by reaction of infiltrated water on phosphorus. Furthermore, since phosphorus is not diffused, a gold-aluminum intermetallic compound produced when a gold line is pressed on an aluminum film for connection can be prevented from deteriorating. Therefore, the reliability of a semiconductor device can be enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a bonding pad, comprising the steps of:
   preparing a semiconductor substrate,
   forming underlying films on said semiconductor substrate,
   forming an insulating film including phosphorus on said underlying films,
   etching away a portion of the region in which said bonding pad is to be formed on said insulating film and providing an opening in said insulating film,
   forming an aluminum film on said insulating film having said opening formed and said underlying films,
   applying a resist film to a region inside of said opening region on said aluminum film, etching away unnecessary portions of the aluminum film and underlying films utilizing said resist film and said insulating film as masks to separate the aluminum. film from the insulating film, and
   forming a diffusion preventing film for preventing diffusion of phosphorus in a region between said separated aluminum film and insulating film including phosphorus.

* * * * *